United States Patent [19]

Kupfer

[11] Patent Number: 4,525,681
[45] Date of Patent: Jun. 25, 1985

[54] NARROW-BAND AMPLIFIER, MORE SPECIFICALLY TELEVISION INTERMEDIATE FREQUENCY AMPLIFIER

[75] Inventor: Karl H. Kupfer, Krefeld, Fed. Rep. of Germany

[73] Assignee: U.S. Philips Corporation, New York, N.Y.

[21] Appl. No.: 481,536

[22] Filed: Apr. 4, 1983

[30] Foreign Application Priority Data

Apr. 10, 1982 [DE] Fed. Rep. of Germany ....... 3213406

[51] Int. Cl.$^3$ .............................................. H03F 3/60
[52] U.S. Cl. .................................... 330/286; 330/291; 330/296; 330/297; 330/306; 330/66
[58] Field of Search .................... 330/53, 66, 202–204, 330/286, 291, 296, 297, 306, 307; 358/184

[56] References Cited

U.S. PATENT DOCUMENTS 3,530,411  9/1970  Sear ................................ 330/306 X Primary Examiner—James B. Mullins
Attorney, Agent, or Firm—Thomas A. Briody; William J. Streeter; Edward W. Goodman

[57] ABSTRACT

With narrow-band amplifiers whose output line is located close to the input line, an unwanted feedback may be produced which results in self-excitation of the circuit or at least in a reduction of the bandwidth. According to the invention, a supply line is arranged between the two lines, which supply line is completed with a capacitor to provide a resonant circuit which resonates at the signal frequency of the narrow-band amplifier. As result thereof, energy is withdrawn from the feedback path, causing the feedback to be reduced.

3 Claims, 2 Drawing Figures

NARROW-BAND AMPLIFIER, MORE SPECIFICALLY TELEVISION INTERMEDIATE FREQUENCY AMPLIFIER

BACKGROUND OF THE INVENTION

The invention relates to a narrow-band amplifier the input line of which is provided on a printed circuit board, at least partly, very close to a line at the output of the amplifier.

With amplifier circuits provided on a printed circuit board, it is often unavoidable, inter alia because of the available space, that input and output lines of the amplifier are provided extremely closely to each other on the printed circuit board. This may cause a portion of the signal energy to be fed back from the output to the input, which may result in self-excitation when the input signal and the fed-back output signal have the same phase. Effects of such a type may be particularly pronounced when a parallel-resonant circuit is provided at the input of the amplifier and the input line is coupled to an output line through which the current through one of the reactances flows and/or when a parallel-resonant circuit tuned to the same frequency is connected to the input circuit.

SUMMARY OF THE INVENTION

The present invention has for its object to prevent to a very large extent, the effects of the above-described feedback from occurring in an amplifier of the above-described type.

According to the invention, this is accomplished in that a direct current supply line of the amplifier is arranged between the two lines, to which supply line two capacitors are connected at a predetermined distance from each other, one capacitor forming substantially a short-circuit for the signal frequency and the other being dimensioned such that, together with the line section located between the two capacitors, it provides a parallel-resonant circuit which resonates in the region of the signal frequency of the amplifier and that this line section is located in the region of the closely adjacent input and output line sections of the amplifier.

The feedback is reduced in accordance with the invention in that the d.c. voltage supply line forms, at the same time, a portion of the parallel-resonant circuit which is tuned to the frequency near the signal frequency and absorbs a portion of the energy from the output line and which will be designated an absorption circuit hereinafter. This requires two capacitors, one of which, which shortcircuits a.c. voltages of the signal frequency, must usually already be present, so that for the measure in accordance with the invention only one additional capacitor is required.

The frequency at which the absorption circuit is in parallel resonance depends on the length of the line section between the two capacitors and on the capacitance of the other (smaller) capacitor; this frequency being higher as the line section is shorter and as the capacitance is lower. The resonant frequency must not be too far from the signal frequency as otherwise only very little energy is coupled into the supply line, so that the coupling between the output and the input lines would hardly be capable of being reduced thereby. On the other hand, the edges of the transmission range of the narrow-band amplifier must not be distorted, in dependence on the frequency, by the absorption circuit.

The efficacy of the absorption circuit does not only depend on the resonant frequency, but also on the coupling to the other, adjacent line sections of the output and input lines and also on the extent to which it is damped. It is the more effective accordingly as the coupling is stronger and the damping is greater. The coupling is determined by the distance between the input and output lines and the supply line as well as by the fact whether the closely spaced sections of the input and output lines are closer to the end which is connected to ground (via the larger capacitor) or closer to the other end. The damping of the absorption circuit is determined by the losses in the supply line—which are however substantially determined by the choice of the material of which the printed circuit board and the conductors are produced—as well as by the losses in the capacitors. In addition, the damping depends on the length of the line and on the capacitance of the capacitors.

DESCRIPTION OF THE DRAWING

The invention will now be further described by way of example with reference to the accompanying drawing, in which.

DESCRIPTION OF THE PREFERRED EMBODIMENT

Figure 1:
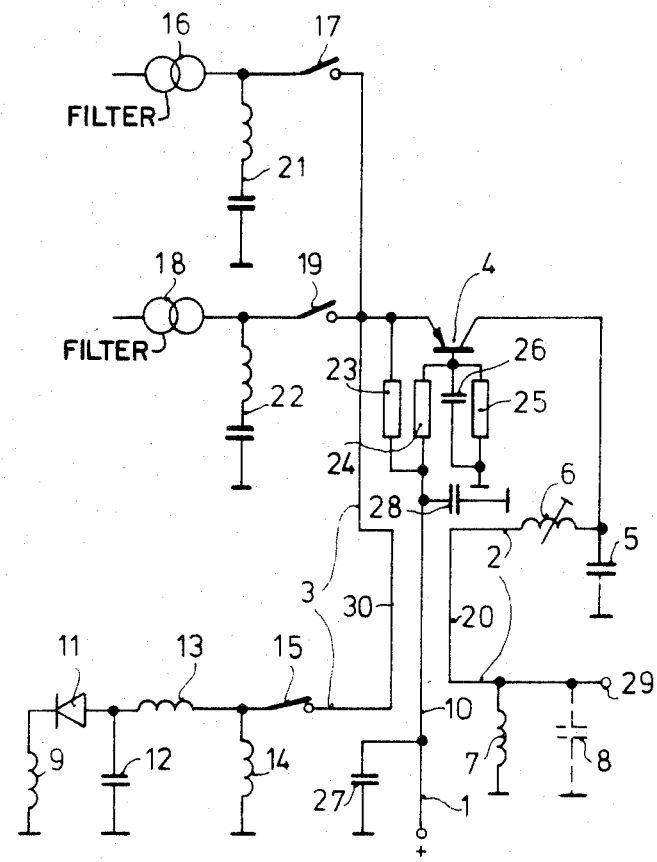
FIG. 1 shows a portion of a circuit of a tuner comprising a narrow-band amplifier in accordance with the invention.

FIG. 1 shows the output of an UHF-VHF tuner. A pnp-transistor 4 of the type BF 324, which is operated in the grounded-base mode and produces the output signal, operates for UHF as an intermediate-frequency amplifier and for VHF as a mixing transistor, the VHF-signal being mixed in the mixing stage with an oscillator signal. The collector of the transistor 4 is connected to a parallel-resonant circuit which is tuned to the intermediate frequency. The parallel-resonant circuit comprises a capacitor 5, one terminal of which is connected to the collector of transistor 4 and the other terminal to ground, and also a coil 6, one terminal of which is connected to the collector of transistor 4 and the other terminal to ground via a line 2 and a coil 7. That terminal of the coil 7 which is not connected to ground provides the output of the amplifier, to which an intermediate-frequency amplifier is connected via a suitable filter. As a result thereof, as is indicated by broken lines, a comparatively large capacitance 8 is arranged in parallel with the coil 7, so that the resonant frequency of the parallel-resonant circuit—the intermediate frequency—is determined almost exclusively by the values of the components 5 and 6; the coil 7 has for its sole object to connect the collector of the transistor 4 to ground for direct current.

The UHF-signals are applied to the circuit via a coil 9, one terminal of the coil being connected to ground and the other terminal to a UHF-mixer diode 11, in which the UHF-signal is mixed with an oscillator signal which is generated in a manner not shown. The other terminal of the mixer diode 11 is connected to ground via a capacitor 12. The junction of the capacitor 12 and the mixer diode 11 is connected via a coil 13 to a coil 14, whose other terminal is also connected to ground. The capacitor 12 and the series arrangement of the two coils 13 and 14, which are arranged in parallel with the capacitor 12, form a parallel-resonant circuit which is tuned to the intermediate frequency and suppresses mixing products which have a frequency which deviates from the intermediate frequency. The ratio between the inductances of the coils 13 and 14 is chosen such that the resonant circuit is matched to the input of the amplifier stage and the junction between the coils 13 and 14 is accordingly connected to the base of the transistor 4 via an electronic switch 15 and a line 3.

When band I-VHF-signals are received, they are applied to the base of transistor 4 via a bandpass filter 16 and a switch 17, while, when signals from the VHF-band III are received, the signals are applied to the base of the transistor 4 via a filter 18 and a switch 19. The outputs of the filters 16 and 18, respectively, are connected to ground via two series-resonant circuits 21 and 22, respectively, which are tuned to the intermediate frequency.

A (positive) supply voltage is applied to the transistor 4 via a line 1, which line 1 is connected to the emitter via a resistor 23 and via a resistor 24 to the base, which is also connected to ground via a resistor 25, a capacitor 26 being arranged in parallel with this resistor 25.

The output line 2 and the input line 3 have sections 20 and 30, respectively, which are extremely close to each other—for example at a distance of 1.5 mm—on the printed circuit board, not shown, and have a given length, for example, 20 mm. This provides a positive feedback from the output to the input. When signals from one of the VHF-bands I or III are received, this positive feedback has substantially no effect, as the input of the transistor 4, which then operates as a mixing stage, is short-circuited for the intermediate frequency by one of the series-resonant circuits 21 or 22. However, in the UHF-position, the switches 17 and 19 being open and the switch 15 being closed and the transistor 4 operating as an intermediate-frequency amplifier, the parallel-resonant circuit 12, 13, 14 is connected to the emitter of the transistor 4 via the switch 15, so that the feedback intermediate-frequency signals may act upon the emitter of the transistor 4. As a result of this positive feedback (regenerative feedback), the bandwidth of the narrow-band amplifier is reduced or becomes unstable when the transconductance of the transistor 4 is sufficiently large.

In order to counteract this feedback effect, the supply line 1 is connected between the two sections 20 and 30, which results in a certain extent of decoupling. At the edge of the printed circuit board, a capacitor 27, which has a capacitance 10 nF and which substantially provides a short-circuit for the intermediate-frequency, is connected to the supply line. A further capacitor 28 connects a point of the supply line 1 to ground at the resistors 23, 24 which are necessary for generating a bias voltage. This creates a line section 10 between the terminals of the two capacitors 27 and 28, which line section 10 is located between the closely adjacent line sections 20 and 30 of the output line 2 and input line 3, respectively. This line section 10 has a given inductance, to which the capacitor 28 is in parallel, and which provides, together with this capacitor 28, a parallel-resonant circuit which resonates at approximately 30 MHz and absorbs a portion of the feedback energy.

Such an absorption circuit would be most effective if when it were accurately tuned to the intermediate frequency. Since, however, still further portions of a bandpass filter, formed of several circuits which may be trimmed differently, must be connected to the output terminal 29 of the amplifier, it may happen that the absorption circuit is tuned to a frequency which deviates from the intermediate frequency to such an extent that the intermediate frequency response curve would evidence significant asymmetries. For that reason a resonant frequency located below the intermediate frequency is chosen for the absorption circuit.

In principle, the resonant frequency of the absorption circuit might indeed alternatively be located above the intermediate frequency, but then it would be at least near the lower channels of the VHF band I, which might cause trouble there. Tuning the absorption circuit to the frequency of 30 MHz is effected by means of a suitable dimensioning of the length of the line section 10—this section has a length of approximately 5 cm—and of the capacitance of the capacitor 28.

The coupling between the two line sections 20 and 30 does not only depend on the resonant frequency of the absorption circuit but also on its damping and on the coupling to the line section 20.

The coupling may be influence in different manners, for example by means of the spacing between the line sections 10 and 20. The coupling depends, however, also on the position of the line section 10 relative to the adjacent sections 20 and 30: the closer the two line sections 20 and 30 are located near the so-called "hot" end of the absorption circuit, which is determined by the point where the capacitor 28 is connected to the line 1, the stronger the coupling.

Also the length of the line section 10 influences the coupling: it will be obvious that the capacitance of the capacitor 28 should then vary in such a way that the same resonant frequency is produced again. The length of the line 10 also influences the damping or the bandwidth of the absorption circuit, respectively, which damping is also determined by the losses in the capacitor 28. In a circuit which was tested in practice, a ceramic capacitor of the type X7R was used which has comparatively large losses (loss factor approximately 0.02).

Figure 2:
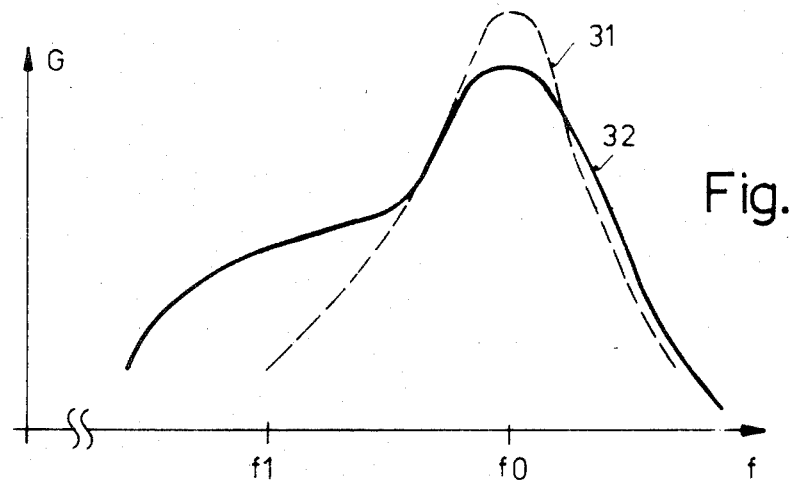
FIG. 2 shows the response curve of the narrow-band amplifier.

FIG. 2 shows the transmission factor of the ininermediate-frequency amplifier, shown in FIG. 1, as a function of the frequency. The broken-line curve 31 shows the frequency variation without the use of an absorption circuit, whereas the solid-line curve 32 represents the frequency variation with the use of an absorption circuit. Without the absorption circuit, a pronounced resonance is produced at the intermediate frequency f0 (36.8 MHz), the 3 dB-bandwidth being less than 2 MHz. The absorption circuit reduces the transmission factor at the resonant frequency, so that a bandwidth of approximately 2 MHz is obtained. (The curve 32 shows the variation of the transmission factor when only the resonant circuit shown in FIG. 1 is connected to the transistor 4. If, in contrast therewith, this circuit is completed, as shown, to provide a bandpass filter consisting of a plurality of circuits, then the 3 dB-bandwidth of 5.5 MHz required for television signals is obtained).

It can be clearly seen that the filter curve 32 varies less steeply at frequencies below the 2 MHz-passband than the curve 31 (without absorption circuit). Coupling and damping of the absorption circuit have been chosen such that the transmission factor at the resonant frequency of the absorption circuit (30 MHz) is approximately 10 dB lower than at the intermediate frequency f0.

The bandwidth change due to manufacturing imperfections can be kept within permissible limits and self-excitation of the intermediate-frequency amplifier in the UHF-mode can be fully prevented by means of the absorption circuit.

What is claimed is:

1. A narrow-band amplifier in which an input line is provided on a printed circuit board, at least partly, very closely to an output line of the amplifier, characterized in that a direct current supply line of the amplifier is arranged between the input and output lines, two capacitors being connected to the direct current supply line at a predetermined distance from each other, one of the capacitors forming substantially a short-circuit for the signal frequency and the other being dimensioned such that together with a section of the direct current supply line located between the two capacitors, said other capacitor provides a parallel-resonant circuit which resonates in the region of the signal frequency of the amplifier and that this line section is located in the region of closely adjacent line sections of the input and output lines of the amplifier.

2. A narrow-band amplifier as claimed in claim 1, in the form of a television intermediate-frequency amplifier, characterized in that the resonant frequency of the parallel resonant circuit is located below the intermediate frequency.

3. A narrow-band amplifier as claimed in claim 2, characterized in that the resonant frequency is located at 30 MHz.

* * * * *